United States Patent [19]

Kurasawa et al.

[11] Patent Number: 5,587,867
[45] Date of Patent: Dec. 24, 1996

[54] SURGE ABSORBER

[75] Inventors: Koichi Kurasawa; Mikio Harada; Takaaki Ito, all of Saitama-ken, Japan

[73] Assignee: Mitsubishi Materials Corporation, Tokyo, Japan

[21] Appl. No.: 266,040

[22] Filed: Jun. 27, 1994

[30] Foreign Application Priority Data

Jun. 30, 1993 [JP] Japan .................... 5-162063

[51] Int. Cl.$^6$ .................................... H02H 1/00
[52] U.S. Cl. ............... 361/118; 361/56; 361/91; 361/111
[58] Field of Search ............... 361/18, 56, 91, 361/118, 127, 111

[56] References Cited

U.S. PATENT DOCUMENTS 4,760,439  7/1988  Borkowicz .................... 357/39
4,975,782  12/1990  Bauer .................... 357/38

Primary Examiner—Jeffrey A. Gaffin
Assistant Examiner—Stephen Jackson
Attorney, Agent, or Firm—McAulay Fisher Nissen Goldberg & Kiel, LLP

[57] ABSTRACT

A surge absorber composed of a surge absorbing element comprising a silicon two-terminal thyristor element having a PNPNP or NPNPN junction structure and a bulk resistance element 12 comprising a material having a resistivity within a range of from $10^{-4}\Omega\cdot cm$ to $10^3\Omega\cdot cm$ and having a resistance value within a range of from $5\Omega$ to $50\Omega$, these elements being connected in series to form an integral body is disclosed. The inventive surge absorber requires reduced manhours for its production and is of a small size, but yet provides a large surge capacity.

8 Claims, 3 Drawing Sheets

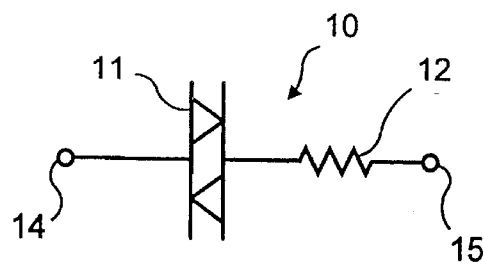
F I G. 5
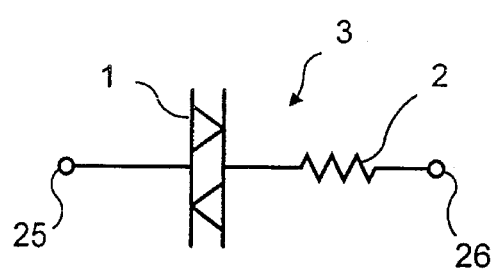
F I G. 6
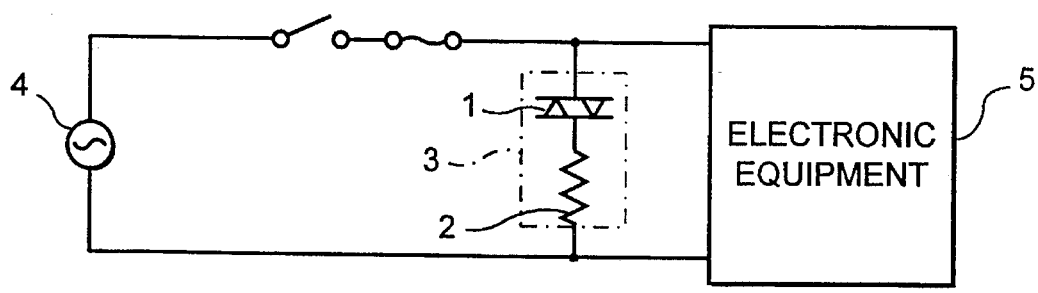
F I G. 7
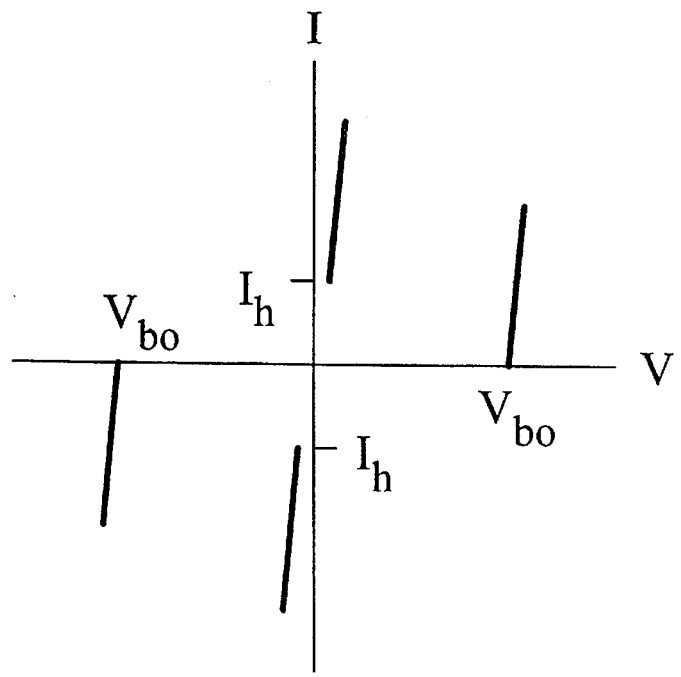
F I G. 8

SURGE ABSORBER

BACKGROUND OF THE INVENTION

The present invention relates to a surge absorber provided in a power supply unit or the like of an electronic equipment susceptible to surge voltage which serves to avoid problems or malfunctions of the electronic equipment caused by surge voltage. More particularly, the present invention relates to a surge absorber using a semiconductor-type surge absorbing element.

A semiconductor-type surge absorbing element is typically represented by a silicon two-terminal thyristor element having a PNPNP or NPNPN junction structure. When a surge voltage higher than a breakover voltage (V bo) is applied between a pair of terminal electrodes and the thyristor is ignited, an electrical short-circuiting takes place between the terminal electrodes and the surge absorbing element absorbs the surge. When a power supply is connected between the electrodes of this surge absorbing element and an electric current of over holding current (Ih) is supplied, the on-state is maintained by the surge. When the current exceeds the current capacity of the element, breakage of the element occurs. To prevent this phenomenon from occurring, the conventional surge absorber 3 has a structure, as shown in FIG. 6, in which a resistor 2 is connected in series to a semi-conductor-type surge absorbing element 1.

As shown in FIG. 7, this surge absorber 3 is connected in parallel with an electronic equipment unit 5 in the upstream portion of the equipment to cope with a surge coming into the electronic equipment 5 from a commercial AC power supply 4.

This semiconductor-type-surge absorbing element 1 has properties as shown in FIG. 8. More specifically, it is necessary to use a breakover voltage (V bo) of the surge absorbing element 1 higher than the peak value (Vp) of the AC source voltage employed. At the same time, it should be appropriately set taking into account the response characteristic to surge and the surge withstanding voltage of the electronic equipment 5. The peak one cycle surge current (I tsm) which is a kind of current capacity of the semiconductor-type surge absorbing element 1 should be as large as possible.

On the other hand, the resistance value (Rs) of the resistor 2 should be set so as to satisfy the formula (1), relative to the peak value (Vp) source voltage employed:

$$Rs > Vp/I\ tsm \quad (1)$$

Accordingly, after ignition of the semiconductor-type surge absorbing element 1 suffering from the incoming surge, the current flowing from the power supply is limited by the resistor 2, and it is thus possible to inhibit the surge voltage without breakage of the surge absorbing element 1.

By selecting the characteristic values of the element in accordance with a concept similar to that described above, this practice is applicable also to a commercial power line of a voltage of AC 200 V, for example, other than AC 100 V.

Furthermore, selection of the characteristic values of an element in this manner permits its application also to a DC power line. In such an application, however, a characteristic value of the semiconductor-type surge absorbing element that must be considered is the holding current (Ih). More particularly, it is desirable to use a semiconductor-type surge absorbing element satisfying the following formula (2) relative to the DC source voltage (V dc) which is adopted and the internal impedance (Rz) of the power supply:

$$Ih > V\ dc/Rz \quad (2)$$

However in the case of the following formula (3)

$$Ih > V\ dc/Rz \quad (3)$$

it suffices to set a value so as to satisfy the following formula (4) relative to the resistance value (Rs) of the resistor 2:

$$Rs > (V\ dc/Ih) - Rz \quad (4)$$

In a surge absorber 3 as shown in FIG. 6, it has been the conventional practice to use a wire wound resistor, a metal film resistor, or a metal oxide film resistor, for example, as the resistor 2, and independently attach a semiconductor-type surge absorbing element 1 and the resistor 2 on the substrate as two separate parts.

The surge absorber thus obtained by separate attachment of the semi-conductor-type surge absorbing element and the resistor on the substrate requires many manhours for mounting on the substrate. Also, it occupies a large area on the substrate, making it impossible to achieve a compact surge absorber.

Since a small-sized wire wound resistor, metal film resistor or metal oxide film resistor leads to a small surge current capacity and cannot be utilized as a part of a surge absorber, it is necessary to use a large-sized resistor. This makes it even more difficult to downsize the surge absorber.

SUMMARY OF THE INVENTION

An object of the present invention is to provide a surge absorber which requires only a few manhours for mounting on a substrate, and results in a compact overall body even with larger surge current capacities.

This is achieved by the inventive surge absorber which is composed of a surge absorbing element comprising a silicon two-terminal thyristor element having a PNPNP or NPNPN junction structure and a bulk resistance element which comprises a material having a resistivity within a range of from $10^{-4} \Omega \cdot cm$ to $10^{3} \Omega \cdot cm$, and a resistance value within a range of from $0.5 \Omega$ to $50 \Omega$; wherein the thyristor element and resistance element are connected in series to form an integral body.

BRIEF DESCRIPTION OF THE DRAWINGS

FIG. 5 is an equivalent circuit diagram illustrating the surge absorber of an embodiment of the present invention:

FIG. 6 is an equivalent circuit diagram illustrating a conventional surge absorber;

FIG. 7 is a circuit configurational diagram including a surge absorber, an electronic equipment and an AC power supply; and FIG. 8 is a characteristic diagram of the semiconductor-type surge absorbing element.

DETAILED DESCRIPTION OF THE INVENTION

Figure 1:
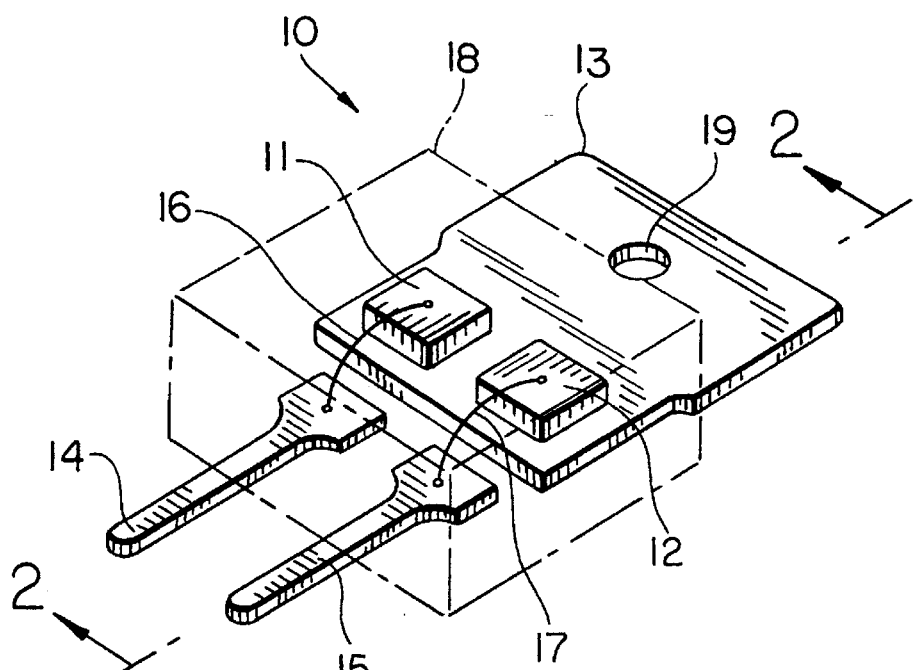
FIG. 1 is a perspective view illustrating the surge absorber of the present invention.

Referring to FIG. 1, the present invention provides a surge absorber 10 having a surge absorbing element 11 comprising a silicon two-terminal thyristor element which has a PNPNP or NPNPN junction structure and a bulk resistance element 12 mounted on metal plate 13. The thyristor element and resistance element are connected in series to form an integral body. The bulk resistance element is composed of a material having a resistivity within a range of from $10^{-4}\Omega\cdot$cm to $10^3\Omega\cdot$cm, having a resistance value within a range of from $0.5\Omega$ to $50\Omega$.

In the drawings, the numerals refer to the below indicated elements:

11: Surge absorbing element
12: Bulk resistance element
13: Metal plate
14, 15: Leads
16, 17: Bonding wires
18: Insulating resin
21: Connected pair
22: Insulating pipe
23, 24: Metal electrodes
25, 26: Leads The inventive surge absorber operates as follows:

When a surge voltage higher than a breakover voltage (V bo) is applied between the terminal electrodes of the semiconductor-type surge absorbing element 11 and the thyristor is ignited, electrical short-circuiting takes place between the terminal electrodes, and the surge absorbing element absorbs the surge. In this case, even if a power supply is connected between the electrodes of the surge absorbing element 11 and a current of over the holding current (Ih) flows owing to the surge, a bulk resistance element 12, having a large surge current capacity, connected in series to the surge absorbing element 11 disconnects the current and thus prevents breakage of the surge absorbing element 11.

The bulk resistance element should preferably have a resistivity within a range of from $10^{-4}\Omega\cdot$cm to $10^3\Omega\cdot$cm. A resistivity of under $10^{-4}\Omega\cdot$cm results in a large-sized bulk resistance element, thus preventing achievement of a compact surge absorber. A resistivity of over $10^3\Omega\cdot$cm leads to a small bulk resistance element, thus making its manufacture difficult.

The resistance value of the bulk resistance element should preferably be at least $0.5\Omega$ with a view to preventing follow current. A resistance value of over $50\Omega$ results, on the other hand, in a high voltage at both ends of the resistance element, thus leading to a higher voltage acting on the electronic equipment. The resistance value should therefore be up to $50\Omega$.

The following examples illustrate the invention:

EXAMPLE 1

Figure 2:
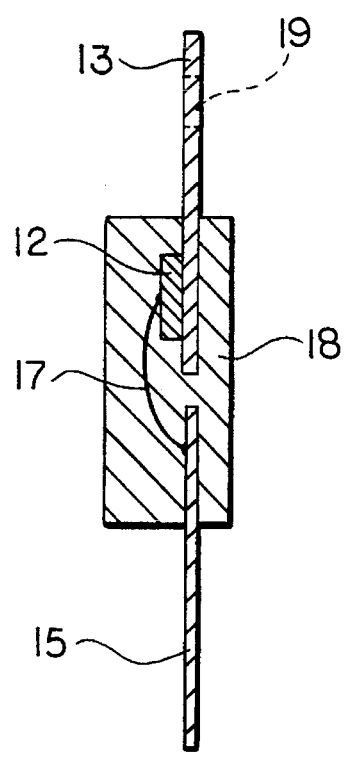
FIG. 2 is a sectional view of FIG. 1 along the line A—A.

As shown in FIGS. 1 and 2, a surge absorber 10 was provided with a semiconductor-type surge absorbing element 11 and a bulk resistance element 12. The surge absorbing element 11 comprised a two-terminal thyristor element, which had a silicon PNPNP junction structure, having a length of about 3 mm, a width of about 3 mm and a thickness of about 1 mm, and the bulk resistance element 12 comprised silicon having a length of about 3 mm, a width of about 3 mm and a thickness of about 1 mm.

The surge absorber 10 was assumed to be used in a commercial 100-V AC power supply. The surge absorbing element 11 had a breakover voltage (V bo) of about 500 V, and a peak one cycle surge current (1 tsm) of 150 A (one cycle of 50 Hz AC current, peak value 150 A). The resistance element 12 had a resistance value of about $3\Omega$.

These elements 11 and 12 were arranged on a metal plate 13, and an electrode surface of each element was secured to the metal plate 13 by soldering. The metal plate 13 is of a material which possesses a satisfactory bonding ability by soldering, and a high thermal conductivity. Copper is typical of such materials. The other electrode surface of each element was connected through bonding wires 16 and 17 to a pair of leads 14 and 15. These assemblies were sealed with an insulating resin 18, such as, epoxy resin, to form an integral body. In the drawings, 19 is an attachment hole for the surge absorber 10.

The surge absorber 10 having the structure as described above constituted an equivalent circuit shown in FIG. 5. The resistance element 12 and the surge absorbing element 11 are identical in shape and size with each other, so that they could easily be attached onto a single metal plate 13. By sealing these elements together with the leads 14 and 15 with the insulating resin 18, it is possible to easily assemble these parts, and at the same time, to achieve a compact surge absorber 10. By inserting the pair of leads 14 and 15 into female terminals, not shown, it is possible to easily mount the surge absorber onto a substrate or the like.

EXAMPLE 2

Figure 3:
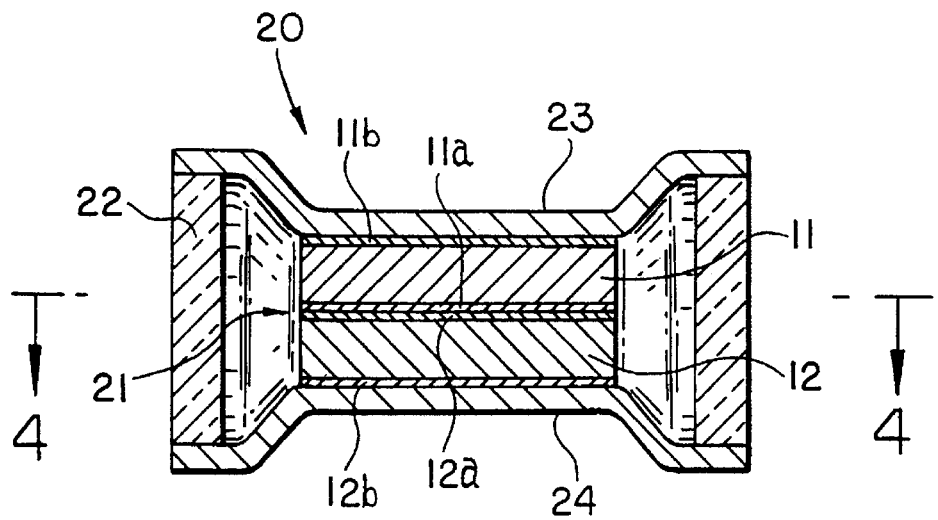
FIG. 3 is a sectional view of another embodiment of the surge absorber of the present invention cut along the line C—C of FIG. 4.
Figure 4:
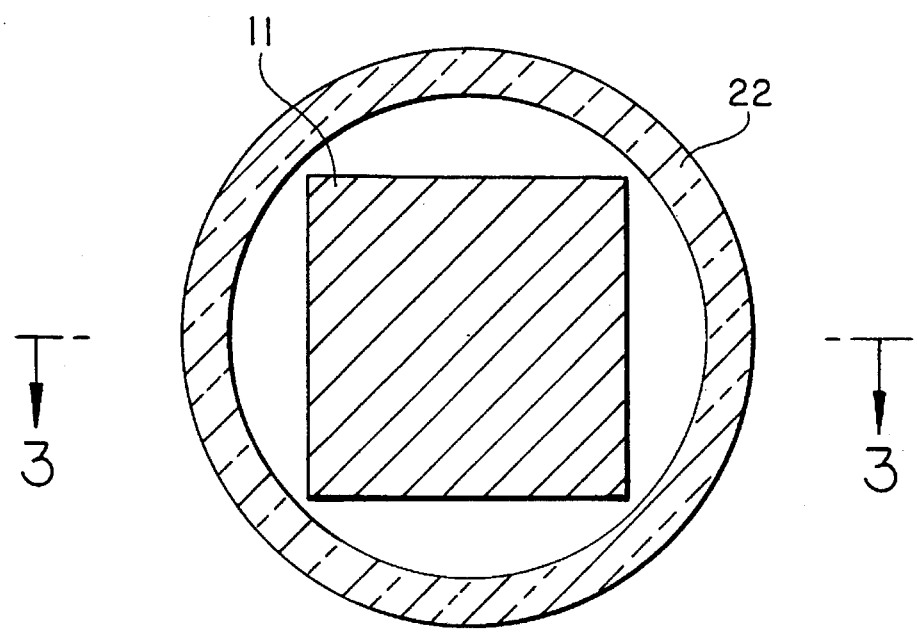
FIG. 4 is a sectional view of FIG. 3 cut along the line B—B.

As shown in FIGS. 3 and 4, the surge absorber 20 of this example was provided with the same surge absorbing element 11 and bulk resistance element 12 as in Example 1. A terminal electrode surface 11a of the surge absorbing element 11 was connected to a terminal electrode surface 12a of the bulk resistance element 12, by soldering, and the thus connected pair 21 were housed in an insulating pipe 22 comprising lead glass having a low melting point for sealing a semiconductor. A pair of metal electrodes 23 and 24 sandwiching the other terminal electrode surface 11b of the surge absorbing element 11 and the other electrode surface 12b of the bulk resistance element 12 was attached to both ends of the insulating pipe 22. The material for electrodes 23 and 24 is not limited to any particular metal so long as it has a thermal expansion coefficient matching that of the insulating pipe 22. In this example, a metal electrode prepared by drawing a clad material comprising 58 wt.% iron-42 wt.% nickel alloy and copper was employed. The insulating pipe 22 was filled with an inert gas, i.e., argon gas.

Since the surge absorbing element 11 and the resistance element 12 were connected in series and closely adhered back to back to each other, the surge absorber 20 having this construction could be formed into a very compact size. Because the connected pair 21 are hermetically sealed in an inert gas, oxidation and other deterioration of the elements can be prevented, and a high reliability is ensured for a long period of time.

In the above-mentioned example, a glass pipe was used as the insulating pipe. However, a mullite ceramic, forsterite ceramic, alumina ceramic, steatite ceramic or other ceramic pipe and the like could be used. The pipe in this case was sealed with the metal electrodes with a brazing material.

The insulating pipe was filled with an inert gas, but it suffices to keep it under vacuum.

According to the surge absorber of the present invention, as described above, it is possible to achieve a large electrical surge current capacity, an easier structural engagement of the resistance element with the surge absorbing element and a compact size because a small-sized bulk resistance element is adopted as the resistance element and connected in series with the semiconductor-type absorbing element into an integral body.

As a result, it is possible to reduce the manhours required for mounting on the substrate and to minimize the area occupied on the substrate. Application of this surge absorber in the power circuit of an electronic equipment permits avoidance of trouble or malfunction of the electronic equipment caused by surge voltage.

What is claimed is:

1. A surge absorber which comprises:

a surge absorbing element comprising a silicon two-terminal thyristor element having a PNPNP or NPNPN junction structure; and a bulk resistance element which comprises a material having a resistivity within a range of from $10^{-4}\Omega\cdot cm$ to $10^{3}\Omega\cdot cm$, and a resistance value within a range of from $0.5\Omega$ to $50\Omega$;

said thyristor element and said bulk resistance element being connected in series to form an integral body.

2. The surge absorber of claim 1, wherein the surge absorbing element and the bulk resistance element each have first and second terminal surfaces; the first terminal electrode surface of the surge absorbing element and the first terminal electrode surface of the bulk resistance element are secured to a single metal plate; the second terminal electrode surface of the surge absorbing element and the second terminal electrode surface of said bulk resistance element are connected through first and second bonding wires to first and second leads, respectively; and said surge absorbing element and said bulk resistance element, and the bonding wire junctions of the first and second leads are sealed with an insulating resin.

3. The surge absorber of claim 1 wherein the thyristor element and bulk resistance element are sealed together with an insulating resin.

4. The surge absorber of claim 1 wherein said bulk resistance element is made of silicon.

5. The surge absorber of claim 2 wherein the bulk resistance element is made of silicon.

6. The surge absorber of claim 1, wherein the first terminal electrode surfaces of the surge absorbing element and the bulk resistance element are connected together; the connected surfaces are housed in an insulating pipe; a pair of metal electrodes sandwiching the second terminal electrode surfaces of the surge absorbing element and the bulk resistance element is in hermetic securement with the ends of the insulating pipe.

7. The surge absorber of claim 6 wherein the hermetic securement is under an inert gas atmosphere.

8. The surge absorber of claim 3 wherein the bulk resistance element is made of silicon.

* * * * *